United States Patent [19]

Zhang et al.

[11] Patent Number: 5,815,014

[45] Date of Patent: Sep. 29, 1998

[54] TRANSISTOR BASED FREQUENCY MULTIPLIER

[75] Inventors: Xiangdong Zhang, Nashua, N.H.; Yong-Hoon Yun, Acton, Mass.

[73] Assignee: The Whitaker Corporation, Wilmington, Del.

[21] Appl. No.: 753,627

[22] Filed: Nov. 27, 1996

Related U.S. Application Data

[60] Provisional application No. 60/020,847 Jun. 28, 1996.

[51] Int. Cl.$^6$ .............................. H03B 19/00; H03L 7/00
[52] U.S. Cl. ....................... 327/122; 327/119; 327/113; 327/355; 327/256; 455/333
[58] Field of Search .................................. 327/100, 105, 327/113, 114, 116, 119, 122, 355, 356, 359, 256; 455/323, 330, 326, 333; 333/218; 257/197, 577

[56] References Cited

U.S. PATENT DOCUMENTS

| 3,519,846 | 7/1970 | Bacci | 327/122 |
|---|---|---|---|
| 4,130,765 | 12/1978 | Arakelian et al. | 307/220 |
| 5,097,312 | 3/1992 | Bayraktaroglu | 257/197 |
| 5,130,667 | 7/1992 | Chang et al. | 330/253 |
| 5,194,820 | 3/1993 | Besson et al. | 327/122 |

FOREIGN PATENT DOCUMENTS

| 57184306 | 11/1982 | Japan | H03B 19/06 |
|---|---|---|---|
| 60054503 | 3/1985 | Japan | H03B 19/14 |
| 0176308 | 8/1987 | Japan | 455/333 |
| 0293833 | 7/1988 | Japan . | |

OTHER PUBLICATIONS

G.R. Jessop: "VHF/UHF Manual", Radio Society of Great Britain, Potters Bar, GB 1992 XP002039677, p. A.18,A.19.
Stephan A. Mass, "Nonlinear MIcrowave Circuits" pp. 315–319, pp. 413–414, pp. 307–311.

Christen Rauscher IEEE Transactions on Microwave Theory and Techniques vol. MTT–31, No. 6 Jun. 1983 pp. 465–473.

A.S. Daryoush, X. Zhang, and J.Y. Lin (1/4 W Optical Receiver and Clock Recovery Circuit for GB/S Digital Fiberoptic Links) 6/96 pp. 891–893.

6th Mar. 1975 vol. 1 No. 5, R.W.J. Barker (B.J.T. Frequency Doubling with Sinusoidal Output) pp. 160–107.

(Odd Order Mesfet Multipliers with Broadband, Efficient, Low Spurious Response) Ofira Von Stein, Jim Sherman, 6–96 pp. 667–670.

(High Frequency Doubler Operation of GaAs Field–Effect Transistors) Christen Rauscher, Senior Member, IEEE Transaction on Microwave Theory and Techniques, vol. MTT–31, No. 6, 1983.

Primary Examiner—Timothy P. Callahan
Assistant Examiner—Dinh Le

[57] ABSTRACT

A frequency multiplier circuit receives an input signal and generates an output signal. The input waveform (110) has a frequency $F_1$. The output waveform (112) has a frequency $nF_1$ wherein n is an even integer. The frequency multiplier circuit comprises first and second transistors $T_1$ and $T_2$, each transistor having a base, emitter, and collector. The emitters of each transistor are coupled together and are connected to an output load (108). The collectors of each transistor are coupled together and are connected to a voltage potential (109). The base of each transistor receives an input waveform, wherein a first input waveform (110) at the first transistor base is 180° out of phase with a second input waveform (111) at the second transistor base.

18 Claims, 5 Drawing Sheets

——Power at 1x fre
——Power at 2x fre
——Power at 3x fre
- - -Power at 4x fre

TRANSISTOR BASED FREQUENCY MULTIPLIER

This application claims the benefit of U.S. Provisional application Ser. No. 60/020,847, Filed Jun. 28, 1996.

FIELD OF THE INVENTION

The present invention relates to a frequency multiplier circuit.

BACKGROUND OF THE INVENTION

Oscillator sources for high frequency applications are in an ever increasing demand in the wireless industry. In many applications there is an additional requirement that the cost of the oscillators be kept as low as possible for suitable implementation into consumer goods, for example, cellular telephones. There is a need in the wireless industry is for high frequency multiplier that has performance characteristics of ample power gain and low input power level that can be used as a high frequency source. Furthermore, there is a requirement that the device be fabricated in quantity at low price. Conventionally, to effect an oscillator source at greater than 6 GHz, a device, a diode or transistor for example, is driven in its nonlinear range at a fundamental frequency. The resulting output spectrum results in significant output power of the fundamental as well as higher order harmonics of the fundamental. Both the fundamental and the unwanted harmonics must be filtered to realize the desired multiplied signal. Typically, the power at the fundamental is greater than the power of each harmonic. Disadvantageously, in order to achieve adequate fundamental rejection with minimum attenuation of the desired harmonic, the bandpass filter is relatively complex either in lumped element or transmission line form. In addition to increasing the complexity of the oscillator which intrinsically increases the cost of the resultant product, there is also an inherent loss in output power due to the fact that a significant amount of power spectrum is filtered out by the bandpass filter. To effect an output having the desired output power level, the input power must be an unacceptably high value. Conversion gain in a conventional oscillator based on such a frequency multiplication circuit is inefficient because of the rejection of so many harmonics in effecting the desired output. Such a circuit requires relatively complicated filtering and results in significant power loss at the output stage. Compensating efforts to correct the power loss by increasing input power, and or implementing higher order bandpass filtering drives the overall efficiency, size and price of a device having suitable performance characteristics to an unacceptable level for many wireless applications.

Another conventional frequency multiplier is a diode implemented full wave rectifier circuit. A fully rectified sinusoid advantageously generates fewer and higher powered harmonics. A rectifier circuit, however, is passive and inherently lossy. Additionally, the low input impedance of the diode requires high input power for the driving signal. An inherently lossy circuit requiring high input power is in contravention of the general trend in the wireless industry towards lower power and improved efficiency.

Accordingly, what is needed is a way to effect the desired frequency and output performance at a minimum input power level, while providing a power efficient product at minimum cost.

SUMMARY OF THE INVENTION

It is an object of the present invention to provide a frequency multiplier circuit which does not require band pass filtering to eliminate unwanted fundamental and harmonic frequency components.

It is an object of the present invention to provide a frequency multiplier circuit which has a linear power relation between an input signal and an output signal.

It is an object of the present invention to provide a frequency multiplier having a frequency conversion gain that is relatively independent of input power level.

It is an object of the present invention that a frequency multiplier exhibits efficient signal gain.

It is an object of the present invention that the output waveform frequency is an even integer multiple of the input frequency.

It is an object of the present invention that a frequency multiplier has a high input impedance.

It is an object of the present invention that a frequency multiplier operates over a desired input frequency band.

It is a feature of the present invention that a push-push frequency multiplier circuit comprises first and second transistors, the emitters of the transistors being coupled and the collectors of the transistors being coupled.

A frequency multiplier circuit receives an input signal and generates an output signal. The input waveform has a frequency $F_1$. The output waveform has a frequency $nF_1$ wherein n is an even integer. The frequency multiplier circuit comprises first and second transistors, each transistor having a base, emitter, and collector. The emitters of each transistor are coupled together and are connected to an output load. The collectors of each transistor are coupled together and are connected to a voltage potential. The base of each transistor receives an input waveform, wherein the first input waveform at the first transistor base is 180° out of phase with the second input waveform at the second transistor base.

It is an advantage of the present invention that a frequency doubler circuit has an inherent power gain.

It is an advantage of the present invention that a frequency doubler circuit can operate effectively using a small input signal power level.

It is an advantage of the present invention that a frequency doubler exhibits advantageous power efficiency.

It is an advantage of the present invention that a frequency doubler has an output signal voltage level linearly related to the input signal voltage level.

It is an advantage of the present invention that a frequency doubler circuit is compatible with monolithic microwave integrated circuit (MMIC) fabrication techniques as well as heterolithic microwave integrated circuit (HMIC) fabrication techniques.

DETAILED DESCRIPTION OF THE INVENTION

Figure 1B:
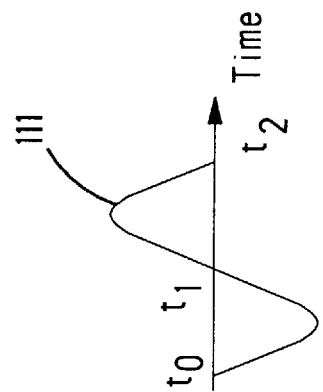
FIG. 1 is an overall view of the circuit diagram of the present invention showing the input and output waveforms.
Figure 1C:
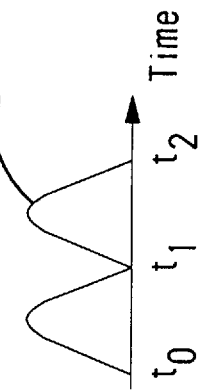
Figure 1:
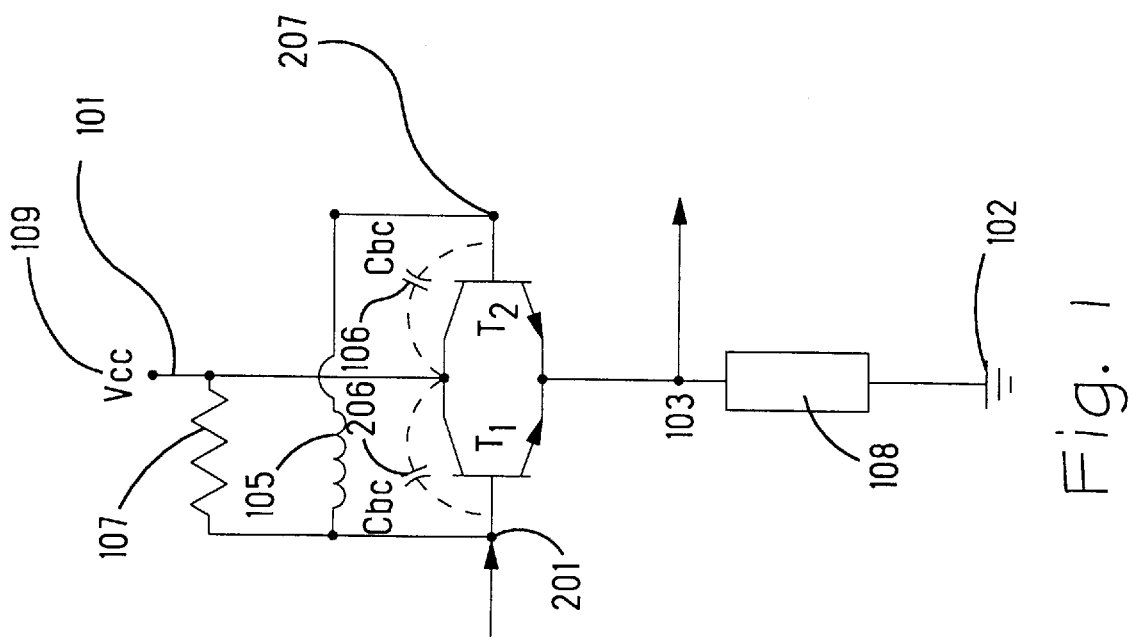
Figure 1A:
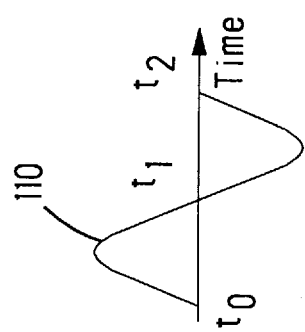
Figure 4:
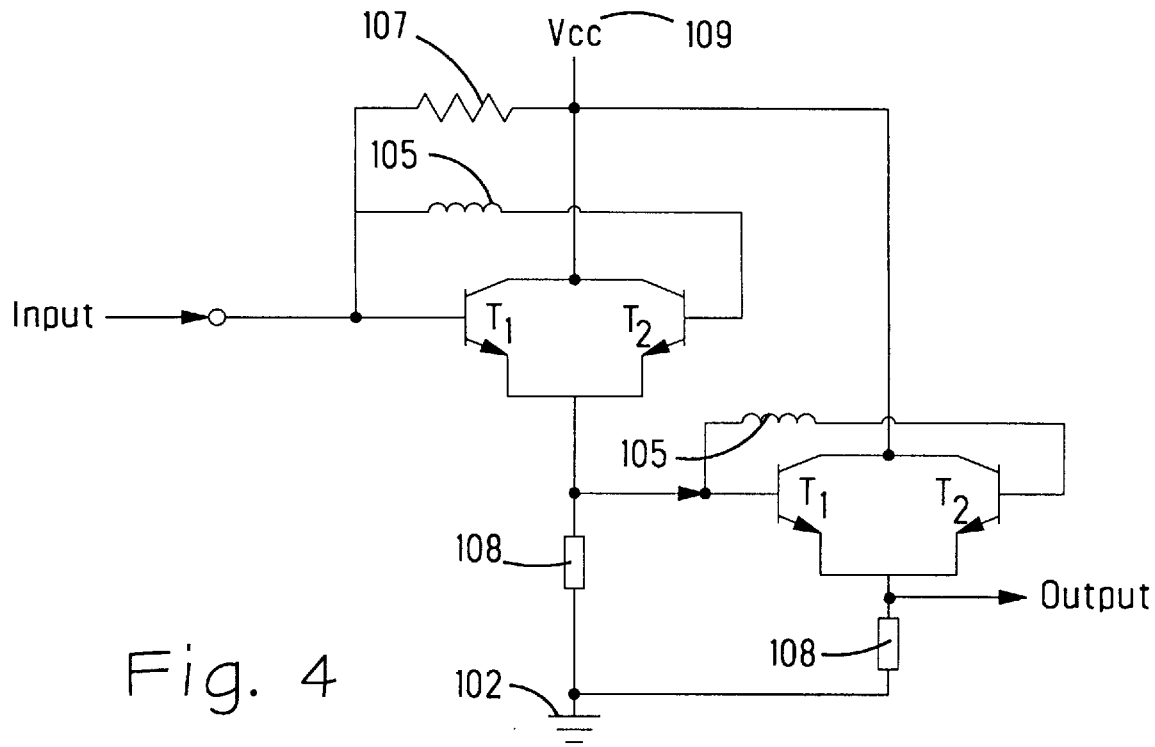
FIG. 4 is a circuit diagram according to the teachings of the present invention illustrating how a frequency doubler may be cascaded to create a frequency quadrupler.

With reference to FIG. 1, there is shown the basic structure of the circuit according to the teachings of the present invention. Transistor $T_1$ is a heterojunction bipolar transistor, although other transistor types are sufficient in this role. Transistor $T_2$ is identical to transistor $T_1$ within performance specification tolerances. The bipolar transistors $T_1$ and $T_2$, have the emitters and collectors respectfully coupled to one another. The emitters are coupled to an output port (103) and the collectors are coupled and connected to $V_{cc}$ (109). The base of the first transistor $T_1$ has connected thereto a resonating inductor L (105) with a value selected such that it will resonate with the junction capacitance $C_{bc}$ (106) of the second transistor $T_2$. A sinusoidal input waveform (110) is applied to the base of the first transistor $T_1$. During a positive half cycle of the input waveform (110) $T_1$ turns on and current flows through $T_1$ with gain $\beta_1$ to the output load (108). Thus, the output voltage at (103) rises following the voltage waveform at the base of $T_1$. In one embodiment, by virtue of the resonant circuit formed by the resonating inductor L(105) and $C_{bc}$ (106), the voltage waveform (111) at the base of $T_2$ is shifted 180° out of phase relative to the input waveform (110) at the base of $T_1$. During the positive half cycle for $T_1$, the transistor $T_2$ is turned off. When the input waveform (110) at the base of $T_1$ enters the negative half cycle, the waveform voltage is reversed in polarity at the base of $T_2$, and, the transistor $T_2$ is turned on. Current flows through $T_2$ with gain $\beta_2$ to the output load (108). Thus, during the first input waveform's (110) negative cycle, the output voltage at (103) rises following the voltage waveform at the base of $T_2$. The resulting output waveform (112) at output port (103) is a full wave rectified signal having twice the frequency of the input signal. The basic frequency doubler described can be cascaded through standard technique in order to effect a frequency quadrupler as shown in FIG. 4. Other even multiples using additional cascaded doubler frequency circuits according to the teachings of the present invention. The resonating inductor L (105) is chosen to form an effective resonant circuit having a resonant angular frequency $\omega_o$. The resonant circuit formed is an LC circuit with the capacitance C being the base collector junction capacitance, $C_{bc}$ (106) of transistor $T_2$. Standard calculation shows that the value of resonating inductor L (105) is on the order of $1/(\omega_o^2 C_{bc})$, where $\omega_o$ is the fundamental frequency of the LC resonator. This frequency is related to the input waveform (110) frequency win by: $\omega o = \omega in/\sqrt{2}$. A bias resistor (107) provides the necessary DC bias to the base of the transistors $T_1$ and $T_2$. The emitters of the transistors are coupled together and are connected to the output matching load (108) from which an output waveform (112) may be tapped at output port (103). The collectors are coupled together and are connected to a DC power supply, $V_{cc}$ (109). In an application in which a positive power supply is used, a positive potential of the DC power supply (109) is connected at 101 with reference potential (102) at the side of the output load (108) opposite the output port (103). If a negative power supply is used, a negative potential is connected at $V_{cc}$ (109) and reference potential at 102.

Figure 2:
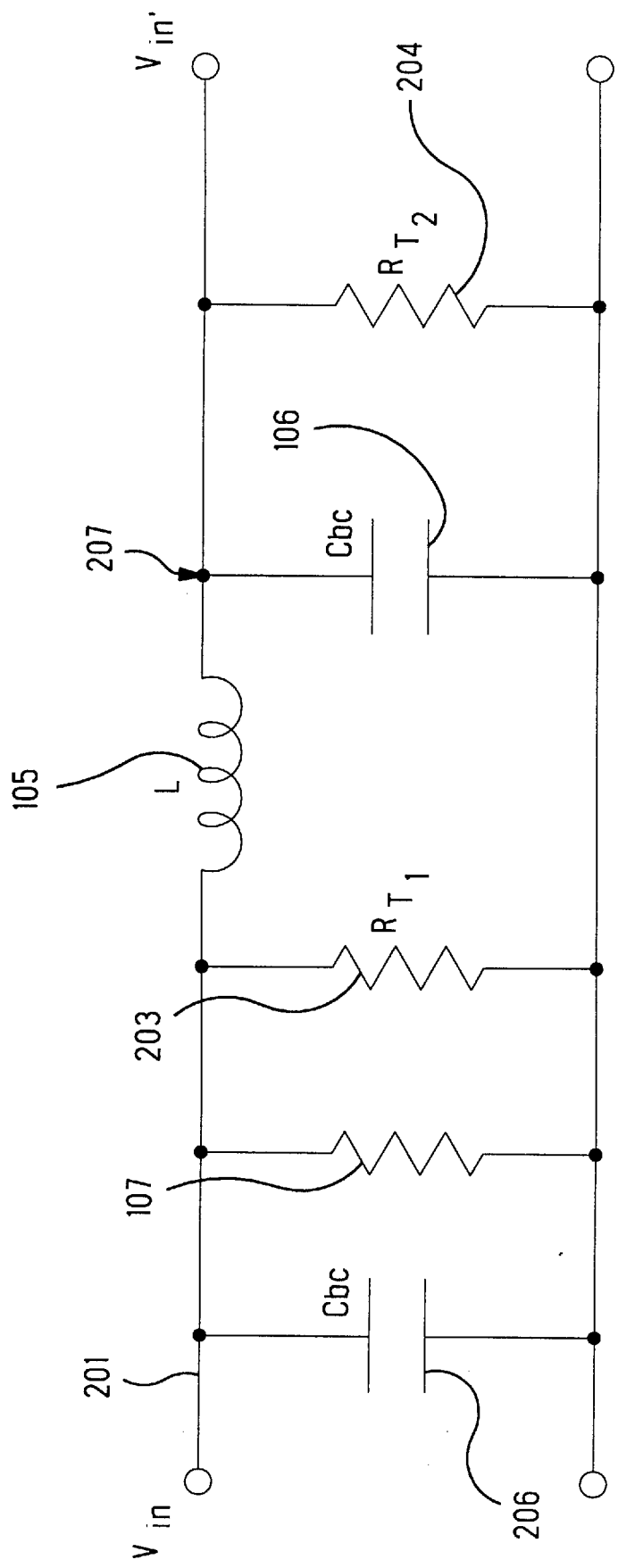
FIG. 2 is an equivalent circuit of the circuit shown in FIG. 1.

With specific reference to FIG. 2, there is shown the structure of an equivalent circuit for the devices shown in FIG. 1. The junction capacitance $C_{bc}$ shown at 106 and 206 of the transistors $T_2$ and $T_1$ respectively are as shown. The intrinsic resistance of the transistors $T_1$ and $T_2$ are shown at 203 and 204, respectively, and the bias resistor is as shown at 107. The resonating inductor L is shown at 105. The point in the equivalent circuit 207 is shown in both FIG. 1 and FIG. 2. By appropriate selection of the value of the resonating inductor (105), a resonant LC tank circuit with $C_{bc}$ (106) of transistor $T_2$ is created. At a desired input waveform frequency, the LC tank circuit causes the input waveform 111 at 207 to be 180° out of phase with the input waveform 110 at 201. A signal input at 201 as $V_{in}$ as shown has a phase $-\pi$ of the signal at 207. This enables the function of the transistors to transform an input sinusoidal waveform (110) to a output waveform (112) having twice the frequency of the input waveform (110).

This is as described hereinbelow.

As is shown in FIG. 1, an input signal (110) between time $t_0$ and $t_1$ as is shown turns transistor $T_1$ on when it reaches positive half cycle. At this point, a current flows through $T_1$ by standard operation of a transistor toward the output load (108). The output voltage at 103 is clearly an emitter follower and therefore rises following the voltage waveform at 201. Because the voltage at 207 is in the negative half cycle by virtue of the 180° phase shift as is described above, the absolute voltage between the base and emitter of $T_2$ is lower than the threshold voltage and the transistor $T_2$ is in an off state. Therefore, during the time period $t_0$ to $t_1$ as shown at the input waveform (112), the output voltage at 103 follows the input voltage at the base of $T_1$. The voltage amplitude of output waveform (112) is a function of the current gain $\beta_1$ of transistor $T_1$ and the output load (108) impedance. During the time period $t_1$ to $t_2$, the input waveform (110) is in a negative half cycle. By virtue of the fact that the input signal is in a negative half cycle, the absolute voltage between the base and the emitter of $T_1$ is lower than the threshold voltage and the transistor $T_1$ turns off. However, by virtue of the 180° phase shift, the waveform at the base of transistor $T_2$ at (207) is in a positive half cycle. The transistor $T_2$ turns on and a current flows through $T_2$ and through the output load (108). Thus, the output voltage at 103 rises following the voltage waveform (111) at the base of the transistor $T_2$ at 207 with a voltage amplitude band on the current gain $\beta_2$ of transistor $T_2$ and the output load (108) impedance. Accordingly, the resultant waveform (112) has a primary frequency component twice that of the input waveform (110) and a frequency doubler circuit is effected.

As stated above, the conventional frequency doubler circuits at microwave and rf frequencies, use non linear devices to provide frequency multiplication. Such devices as described above require filtering of unwanted signals and accordingly are complex and expensive circuits having large power consumptions conversion loss and often times low rejection of the fundamental. The present invention on the other hand enables an output voltage swing which is linearly proportional to the input voltage swing, thus resulting in a linear frequency multiplication circuit. The current flowing through the output load is much higher than the input load at the base due to the high current gain of the transistors. The circuit of the present invention has an inherent power gain.

Figure 3:
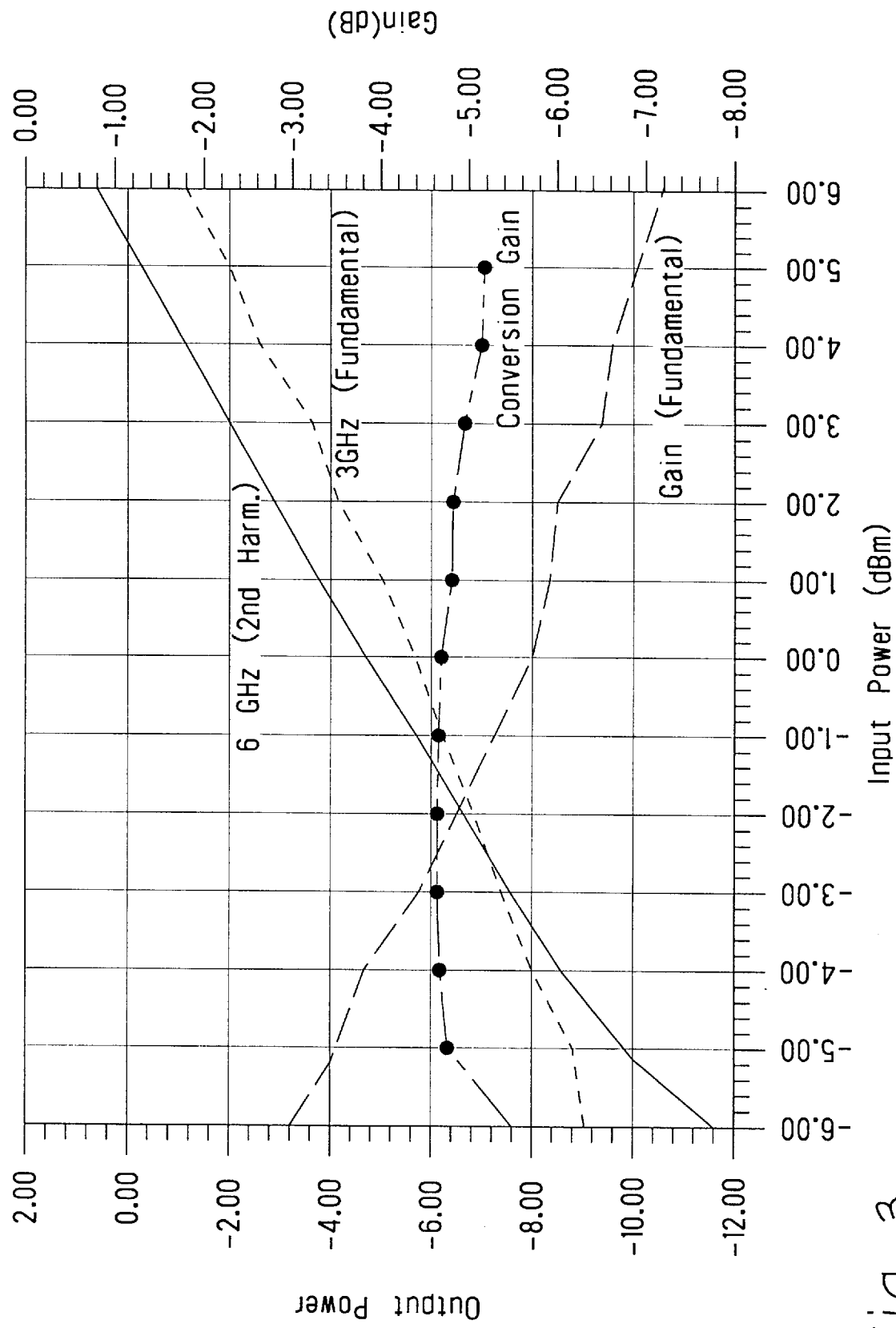
FIG. 3 is a graph of output power versus input power as well as gain.

Since the two transistors do not consume any power during the time period when they are turned off and do not produce an output wave form, the present invention has no need for a high current bias for efficient frequency conversion. The theoretical DC power conversion efficiency is as high as 78%. Accordingly, the circuit has low power consumption. A prototype of the doubler circuit comprises two common collector HBTs (CES02) having an emitter size of 2×3 $\mu m \times 20$ $\mu m$ with an $f_{max}$ at 30 GHz. This HBT has a $C_{bc}$ of approximately 0.6 pF. For operation at 3 GHz to generate a 6 GHz output waveform (112), the resonating inductor L (105) has a value of 3 nH to generate a 180° phase shift between the bases of each transistor at 201 and 207 respectively. The measurement results of a prototype circuit according to FIG. 1 of the drawing which converts a 3 GHz signal to a 6 GHz signal are shown in FIG. 3 as a function of input power. The output power at the fundamental frequency is lower than that at the second harmonic, which indicates the advantage of the circuit in rejection of fundamental signal. The conversion gain of the doubler is almost a constant over the input power range of 10 dB, which demonstrates the linear power relation between the input and output. This function can be used in any amplitude modulated communication systems.

An additional advantage of the present invention is its simplicity in its compatibility with various preferred integrated circuit fabrication techniques. The resulting oscillator of the present invention is readily compatible with monolithic microwave integrated circuits (MMIC) or heterolithic microwave integrated circuits (HMIC). Since the circuit only consists of transistors, resistors and an inductor, the circuit is completely compatible with any Si and GaAs MMIC process and HMIC process. Also due to the simple circuit topology, a compact MMIC layout can be achieved to reduce the cost. Especially by using HMIC, a lossy but high Q inductor can be easily achieved, which in turn will significantly help to improve conversion gain, and fundamental rejection. Examples of HMIC structures are as found in U.S. Provisional Patent Applications (TWC Docket Nos. 16595L and 16573L) and U.S. Pat. No. 5,343,070 to Goodrich et al. the disclosures of which are specifically incorporated herein by reference.

With specific reference to FIG. 4 of the drawings, there is shown a cascaded version of a frequency doubler according to the teachings of the present invention in a configuration to create a frequency quadrupler. In a quadrupler circuit, in order to achieve a 50 Ω output impedance, the first stage doubler has 70 ohm output load (108) and the second stage doubler has a 50 ohm output load (108).

Figure 5:
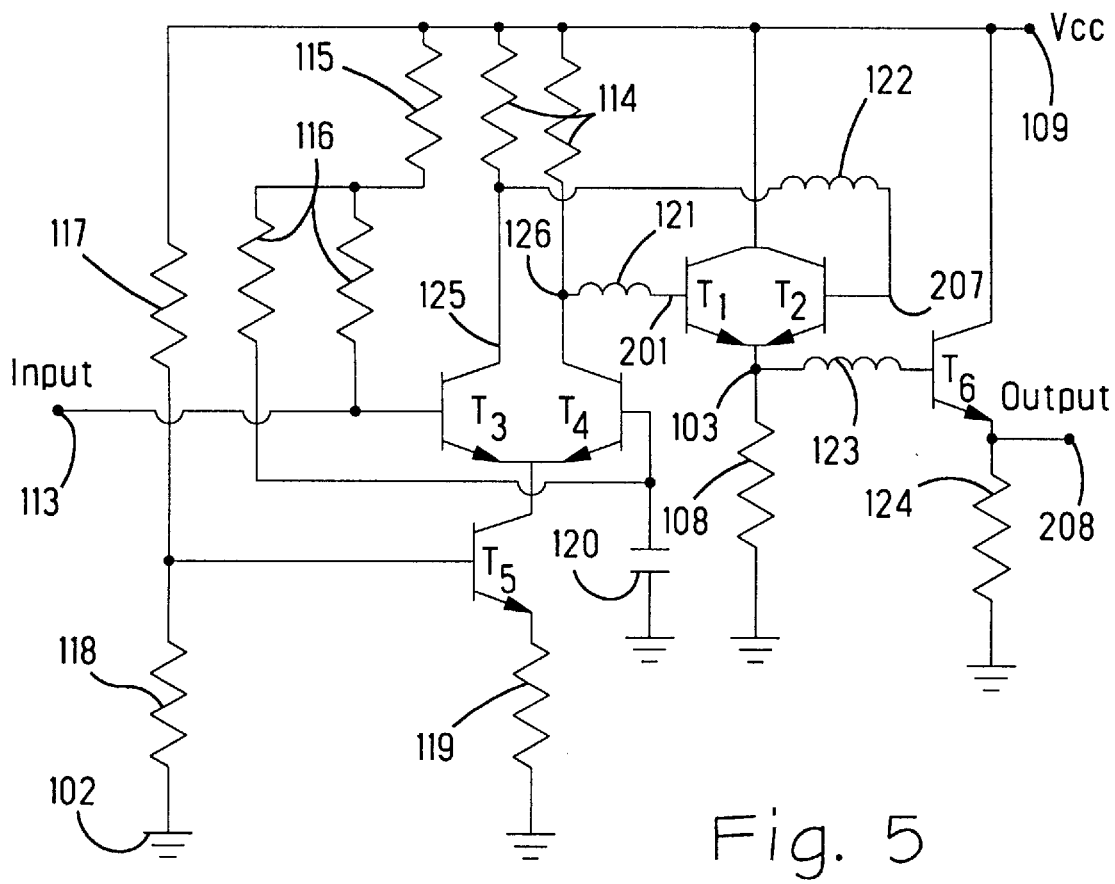
FIG. 5 is a circuit diagram of a frequency multiplier according to the teachings of the present invention shown in conjunction with a phase shifter differential amp and output driver.

In an alternate and preferred embodiment and with specific reference to FIG. 5 of the drawings, there is shown a circuit schematic of a MMIC implemented frequency doubler according to the teachings of the present invention. FIG. 5 illustrates transistors $T_1$ and $T_2$ having the emitters and collectors, respectively, coupled to each other. Also shown is input port 201 and output port 103 of the doubler. As one of ordinary skill can appreciate, wherein like numerals make reference to like parts in FIG. 1 of the drawings, $T_1$ and $T_2$ represent a circuit similar to that shown in FIG. 1 of the drawings. The doubler circuit is used with a phase shifter differential amplifier to create a frequency doubler having a frequency conversion capability over a band of input waveform (110) frequencies. The phase shifter differential amplifier circuit generates two signals, each 180° out of phase relative to each other over a relatively broad frequency range. The phase shifter differential amplifier comprises transistors $T_3$ and $T_4$ having their emitters coupled to each other and to the collector of transistor $T_5$. First and second voltage divider resistors 117, 118 are connected in series between $V_{cc}$ (109) and reference potential (102). The point interposed between the first and second voltage divider resistors is connected to the base of transistor $T_5$ biasing that transistor in its on state. Current source resistor 119 is connected between the emitter of $T_5$ and reference potential 102. In a preferred embodiment the current source resistor 119 is 50 ohms.

In a preferred embodiment first voltage divider resistor 117 is 3 kohms and second voltage divider resistor 118 is 2 kohms. The collectors of transistors $T_3$ and $T_4$ are interconnected to $V_{cc}$ (109) through phase differential collector pull up resistors 114. In a preferred embodiment resistors 114 are 300 ohms each. The base of transistor $T_3$ is pulled high to $V_{cc}$ potential through first phase differential base pull up resistor 116 in series with second phase differential base pull up resistor 115. In a preferred embodiment both resistors 115 and 116 are 10 kohms each. The base of transistor $T_4$ similarly is pulled up to $V_{cc}$ potential through a separate first phase differential base pull up resistor 116 and second phase differential base pull up resistor 115 as shown in FIG. 5 of the drawings. The base of transistor $T_4$ is also interconnected to one side of 40 pF DC isolation capacitor 120, the other side of which is connected to reference potential 102. The operation of the phase shifter circuit is as follows.

The input signal to be multiplied is presented to the phase shifter circuit through input port (113). The transistor $T_3$ which is biased in an on state operates as a constant current source forcing the sum of the current flowing through transistors $T_3$ and $T_4$ to be constant at all time. If there is a reduction in the current flowing through the collector of the transistor $T_3$, the constant current flow through transistor $T_5$ forces an equal and opposite current increase through the collector of transistor $T_4$. Changes in collector current flowing through transistor $T_3$ are a direct result of variations in voltage at the base of transistor $T_3$. Accordingly, the voltage change at the base of transistor $T_3$ as a result of the input signal causes a change in the current flowing through the collector of transistor $T_4$ that is equal and opposite to the change in collector current through transistor $T_3$. Accordingly, the voltage signals at the collector (125) of transistor $T_3$ and the voltage signal at the collector (126) of transistor $T_4$ have the same voltage signal level but in opposite phase relative to each other. The collector (125) of transistor $T_3$ is coupled to the base of transistor $T_2$ through a 3 nH second compensating inductor (122). The collector of transistor $T_4$ is coupled to the base of transistor $T_1$ through a 3 nH first compensating inductor (121). As one of ordinary skill in the art can appreciate, the phase shifter circuit supplies two signals 180° phase shifted from the other for input into the bases of the frequency doubler according to the teachings of the present invention. Use of the phase shifter provides for broader band operation of the frequency doubler. The operation of the circuit, however, is as described hereinabove. The output of the frequency doubler appears at output port (103). The output port is coupled to a driver circuit through a 0.5 nH driver inductor (123). The driver circuit comprises a transistor, $T_6$, having its collector connected to $V_{cc}$ (109), its base coupled to the driver inductor 123, and its emitter connected to a 50 ohm output matching load (124). The other side of the output matching load (124) is coupled to reference potential (102). The emitter of transistor $T_6$ is also connected to a driver output port (208) from which the multiplied signal may be taken. Advantageously, the driver circuit provides for additional gain of the multiplied signal coming from the doubler circuit, provides a higher current signal for use with low impedance output loads, and provides electrical isolation to the doubler circuit. The driver circuit has a certain frequency response with a 3 dB compression point at approximately 17 GHz. While advantageous to achieve higher output power of the multiplied signal, use of the driver circuit degrades frequency response at higher output frequencies. Although it is preferred at lower frequencies, the driver circuit is not recommended at frequencies higher than 16 GHz.

Figure 7:
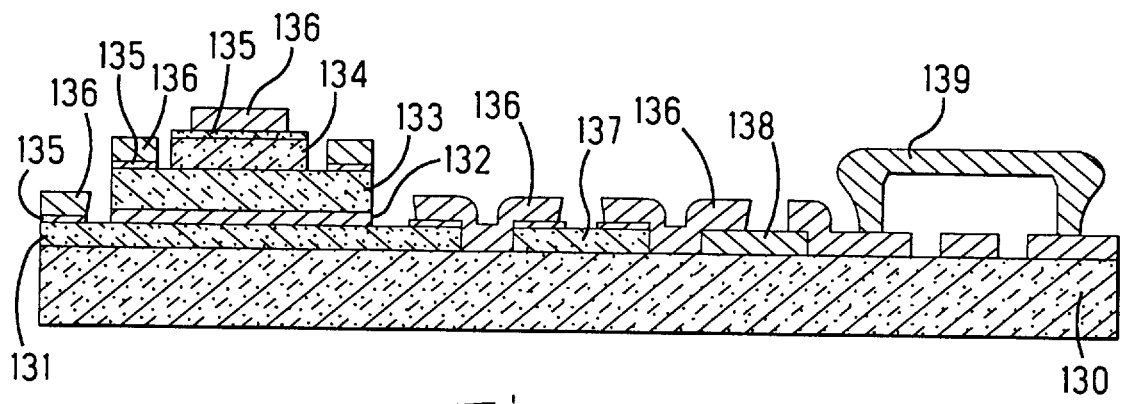
FIG. 7 is a cross sectional view of examples of MMIC components used to implement a frequency multiplier according to the teachings of the present invention illustrating an HBT, a subcollector resistor, a Nichrome resistor and an air bridge used to obtain isolated crossover of conductive traces.
Figure 6:
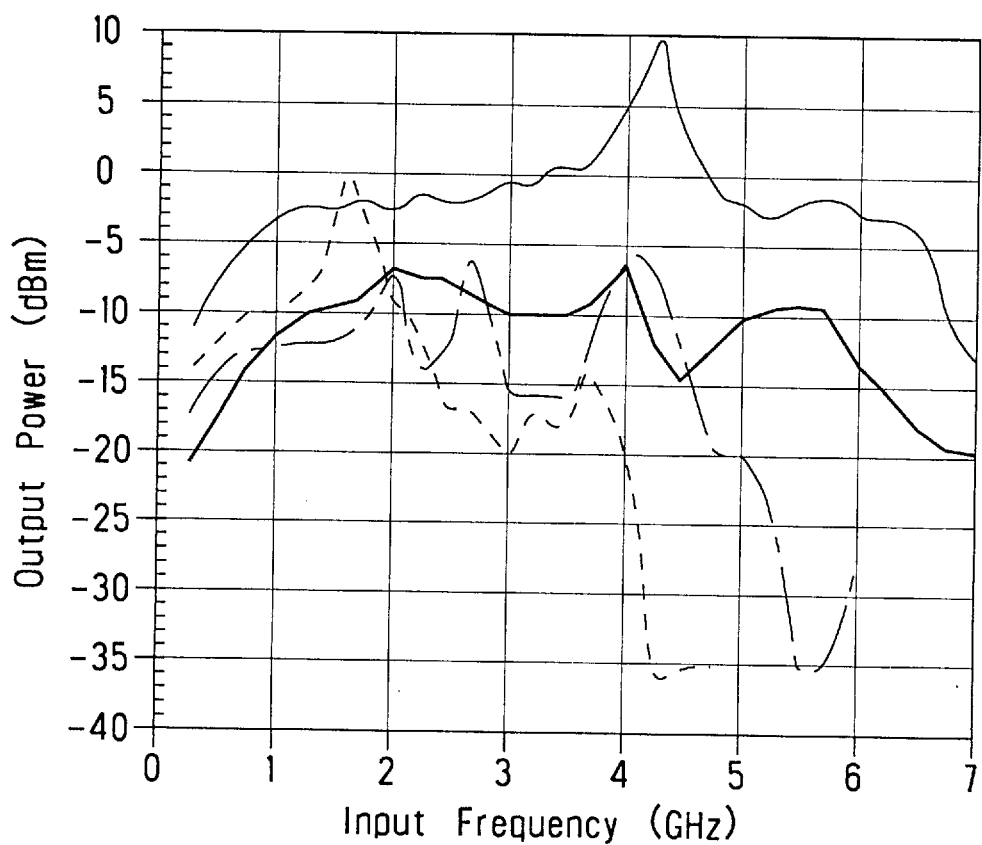
FIG. 6 is a graph of output power shown as a function of input frequency for a circuit according to FIG. 5 illustrating the power level of the fundamental and second, third, and fourth harmonics contained in the resulting output waveform (112).

The preferred MMIC utilizes six two finger HBTs (2×3 $\mu$m×10 $\mu$m). With specific reference to FIG. 7 of the drawings, fabrication of the preferred HBT comprises use of a wafer of semi insulating GaAs (130) having a subcollector layer (131) of n$^+$ silicon doped GaAs of concentration $5\times10^{18}$ atom per cm$^3$. A collector layer (132) is then grown using n type silicon doped GaAs having a $3\times10^{16}$ atom per cm$^3$ concentration. A p doped carbon GaAs base layer (133) is then grown, the carbon having a concentration of $3\times10^{19}$ atom/cm$^3$. AlGaAs is then grown to form the emitter layer (134). The emitter layer comprises three separate layers, with varying mute fractions of Aluminum wherein a layer closest to the base is graded 0–0.3, a middle layer is 0.30, and a layer furthest from the base is graded 0.3–0. Certain selected layers are then opened to create the device itself, after which ohmic contact layers (135) and metal overlay (136) for the wirebonded areas are deposited. In a preferred embodiment the output load resistor (108), the current source resistor (119), and the output matching load (124) comprise subcollector resistors (137). That is, the desired resistance is achieved through use of current flow through a portion of the n$^+$ doped subcollector layer. In a preferred embodiment all remaining resistors comprise a Nichrome resistor layer (138) and are deposited at a different time directly on the semi-insulating GaAs layer (130). The Nichrome resistor layer (138) has a resistivity of 50 ohm per square. The subcollector resistor (137) has a resistivity of 22 ohm per square. The bias for the MMIC according to the fabrication steps herein in the circuit as shown in FIG. 5, is 65 mAmps at 5 V. FIG. 6 of the drawings shows the power of the harmonic content of the output signal as a function of the frequency of the input signal for the circuit of FIG. 5. As one of ordinary skill in the art can appreciate, the second harmonic is the most significant over the frequency range from 250 MHz to 6 GHz input frequency. This translates into an output frequency of 500 MHz to 12 GHz. It is believed that a frequency bandwidth of 18 GHz can be realized by increasing the bias current.

An application has been described in detail using a GaAs HBT, other integrated circuit families however, are possible and are within the spirit and scope of the present invention. Specifically, a silicon BJT based frequency doubler according to the teachings of the present invention, is a possible variant.

The invention having been described in detail, it is clear that modifications and variations of the disclosure of the present invention are apparent to one of ordinary skill in the art. The present invention drawn to a transistor push push frequency doubler and circuit therefore for application at microwave frequencies. To the extent that modifications of both the circuit elements, devices and materials are within the purview of one of ordinary skill in the art, such are deemed to be within the scope of the present invention.

We claim:

1. A frequency multiplier circuit comprises:
an input port and an output port, said input port receiving an input signal having a frequency $F_1$ and said output port transmitting a signal having a frequency $nF_1$ wherein n is an even integer,
first and second transistors, each transistor having a base, emitter, and collector, the emitters of each transistor commoned and connected to said output port, the collectors of each transistor commoned and connected to a voltage source, the base of the first transistor receiving said input signal, and the base of said second transistor connected to the base of said first transistor through an inductor, the second transistor having a junction capacitance $C_{bc}$ between the base and the collector, wherein said inductor value is chosen to form a resonant circuit with said junction capacitance for providing a 180 degrees chase shift between the input signal at the bases of the first and second transistors at said frequency $F_1$.

2. A frequency multiplier circuit as recited in claim 1 wherein said inductor has a value of approximately $2/C_{bc}\omega_{in}^2$ where $\omega$ is an angular frequency of said input signal.

3. A frequency multiplier circuit as recited in claim 1 wherein said first and second transistors are GaAs heterojunction bipolar transistors.

4. A frequency multiplier circuit as recited in claim 1 wherein said first and second transistors are silicon bipolar junction transistors.

5. A frequency multiplier circuit receiving an input signal at an operating frequency and generating an output waveform comprising:
first and second transistors, each transistor having a base, emitter, and collector, said emitters of each transistor coupled together, said collectors of each transistor coupled together,
a phase shifter circuit receiving the input signal and generating first and second input waveforms, the base of said first transistor receiving said first input waveform through a first resonating inductor and the base of said second transistor receiving said second input waveform through a second resonating inductor, said first and second transistors each having respective base to collector junction capacitances $C_{bc}$ and said first and second resonating inductors having respective values to form a resonant circuit with respective values of $C_{bc}$ at the operating frequency.

6. A frequency multiplier circuit as recited in claim 5 wherein said phase shifter circuit comprises third and fourth transistors, said third and fourth transistors each having a base, emitter, and collector, with the emitters of said third and fourth transistors coupled together, and a constant current source coupled to the emitters.

7. A frequency multiplier circuit as recited in claim 6 wherein the collector of said third transistor is coupled to the base of said second transistor.

8. A frequency multiplier circuit as recited in claim 6 wherein the collector of said fourth transistor is coupled to the base of said first transistor.

9. A frequency multiplier circuit as recited in claim 7 wherein the collector of said fourth transistor is coupled to the base of said first transistor.

10. A frequency multiplier circuit as recited in claim 6 wherein the collector of said fourth transistor is coupled to the base of said second transistor.

11. A frequency multiplier circuit as recited in claim 6 wherein the collector of said third transistor is coupled to the base of said first transistor.

12. A frequency multiplier circuit as recited in claim 10 wherein the collector of said third transistor is coupled to the base of said first transistor.

13. A frequency multiplier circuit as recited in claim 5 and further comprising a driver circuit receiving the output waveform.

14. A frequency multiplier circuit as recited in claim 5 wherein said first resonating inductor has a value of approximately $2/\omega^2 C_{bc}$, wherein $\omega$ represents an angular frequency of the first input waveform.

15. A frequency multiplier circuit as recited in claim 5 wherein said second resonating inductor has a value of approximately $2/\omega^2 C_{bc}$, wherein $\omega$ represents an angular frequency of the second input waveform.

16. A frequency multiplier circuit as recited in claim 14 wherein said second resonating inductor has a value of approximately $2/\omega^2 C_{bc}$, wherein $\omega$ represents an angular frequency of the second input waveform.

17. A frequency multiplier circuit as recited in claim 5 wherein said first and second transistors are GaAs heterojunction bipolar transistors.

18. A frequency multiplier circuit as recited in claim 5 wherein said first and second transistors are GaAs silicon bipolar transistors.

* * * * *